(12) United States Patent
Yang et al.

(10) Patent No.: US 9,130,144 B2
(45) Date of Patent: Sep. 8, 2015

(54) MULTIFERRO-HETEROSTRUCTURE COMPOSITION HAVING TUNABLE MAGNETIC COUPLING AT ROOM TEMPERATURE

(71) Applicant: Rhode Island Board of Education, State of Rhode Island and Providence Plantations, Providence, RI (US)

(72) Inventors: Qing (Ken) Yang, Saunderstown, RI (US); Ruihua Cheng, Carmel, IN (US)

(73) Assignee: RHODE ISLAND BOARD OF EDUCATION, STATE OF RHODE ISLAND AND PROVIDENCE PLANTATIONS, Providence, RI (US)

( * ) Notice: Subject to any disclaimer, the term of this patent is extended or adjusted under 35 U.S.C. 154(b) by 0 days.

(21) Appl. No.: 14/397,044

(22) PCT Filed: May 30, 2013

(86) PCT No.: PCT/US2013/043326
§ 371 (c)(1),
(2) Date: Oct. 24, 2014

(87) PCT Pub. No.: WO2013/181370
PCT Pub. Date: Dec. 5, 2013

(65) Prior Publication Data
US 2015/0108592 A1     Apr. 23, 2015

Related U.S. Application Data

(60) Provisional application No. 61/653,864, filed on May 31, 2012.

(51) Int. Cl.
| | |
|---|---|
| *H01L 21/00* | (2006.01) |
| *H01L 21/82* | (2006.01) |
| *H01L 43/02* | (2006.01) |
| *B32B 15/04* | (2006.01) |
| *H01F 10/26* | (2006.01) |

(52) U.S. Cl.
CPC ............... *H01L 43/02* (2013.01); *B32B 15/04* (2013.01); *H01F 10/265* (2013.01)

(58) Field of Classification Search
USPC ................. 257/295, 414, 421, 467, E21.244, 257/E21.255, E21.663, E21.002; 427/128; 428/611
See application file for complete search history.

(56) References Cited

U.S. PATENT DOCUMENTS

| | | | | |
|---|---|---|---|---|
| 8,803,264 | B1* | 8/2014 | Katiyar et al. | 257/421 |
| 2006/0000493 | A1* | 1/2006 | Steger et al. | 134/33 |
| 2007/0252593 | A1* | 11/2007 | Takeuchi et al. | 324/249 |
| 2008/0145693 | A1* | 6/2008 | Zou et al. | 428/611 |
| 2012/0177902 | A1* | 7/2012 | Driscoll et al. | 428/216 |

OTHER PUBLICATIONS

International Preliminary Report on Patentability issued in related International Patent App. No. PCT/US2013/043326 on Dec. 11, 2014.

* cited by examiner

*Primary Examiner* — Mohsen Ahmadi
(74) *Attorney, Agent, or Firm* — Gesmer Updegrove, LLP

(57) ABSTRACT

A ferromagnetic/ferroelectric heterostructure thin film is disclosed that exhibits significant magneto-electric coupling. The ferromagnetic/ferroelectric heterostructure thin film includes a) a base layer of silicon substrate, b) a first copper layer deposited on the silicon substrate, c) a first iron layer deposited on the copper layer, d) first aluminum layer deposited on the first iron layer, e) a polymer layer exhibiting ferroelectric properties deposited on the first aluminum layer, f) a second aluminum layer deposited on the polymer layer; g) a second iron layer deposited on the second aluminum layer, and h) a second copper layer deposited on the second iron layer.

11 Claims, 3 Drawing Sheets

US 9,130,144 B2

MULTIFERRO-HETEROSTRUCTURE COMPOSITION HAVING TUNABLE MAGNETIC COUPLING AT ROOM TEMPERATURE

GOVERNMENT SPONSORSHIP

This invention was made with government support under Grant No.'s CCF-1017177, CCF-0311333 and ECCS-0931820 awarded by the National Science Foundation. The U.S. government has certain rights to this invention.

CROSS-REFERENCE TO RELATED APPLICATIONS

The present invention is a U.S. National Stage filing under 35 U.S.C. 371(c) of International Application No. PCT/US13/43326 filed May 30, 2013, which claims priority to U.S. Provisional Appln. No. 61/653,864 filed on May 31, 2012, both of which are incorporated herein by reference in their entireties.

BACKGROUND

Materials with ferroelectric and ferromagnetic properties with magneto-electric coupling properties are promising candidates for information technology and device fabrication. The preparation and characterization of multiferroic materials in which ferroelectricity and ferromagnetism coexist would represent a significant milestone for the development of highly functionalized materials and devices. Such compositions would present the possibility of electrically controlling magnetic memory devices and, conversely, magnetically manipulating electric devices. In particular, organic multiferoric materials may facilitate the development of a low non-volatile, high density, and high-speed memory device exhibiting low power consumption that may be easily and inexpensively fabricated.

A major impediment to the development of such materials has been the lack of the ability of the devices formed of such materials to function at room temperature. Although single phase and composite multiferroic studies have been reported in cold temperatures, these multiferroic composite heterostructures have shown a very large extrinsic magneto-electric effect at room temperature. For example, the reported values for the magneto-electric coupling sensitivity range from 1 V/(cm×Oe) to 6 V/(cm×Oe), and up to 21 V/(cm×Oe) for bulk composites.

There remains a need therefore, for multiferroic materials in which ferroelectric and ferromagnetic properties may coexist at room temperature.

SUMMARY

In accordance with an embodiment, the invention provides a ferromagnetic/ferroelectric heterostructure thin film that exhibits significant magneto-electric coupling. The ferromagnetic/ferroelectric heterostructure thin film includes a) a base layer of silicon substrate, b) a first copper layer deposited on the silicon substrate, c) a first iron layer deposited on the copper layer, d) first aluminum layer deposited on the first iron layer, e) a polymer layer exhibiting ferroelectrc properties deposited on the first aluminum layer, f) a second aluminum layer deposited on the polymer layer; g) a second iron layer deposited on the second aluminum layer, and h) a second copper layer deposited on the second iron layer.

BRIEF DESCRIPTION OF THE FIGURES

The following description may be further understood with reference to the accompanying drawings in which.

The drawings are shown for illustrative purpose only.

DETAILED DESCRIPTION

Applicant has discover that compared with bulk magneto-electric composites, multiferroic magneto-electric films are attractive because they may be combined at an atomic level. Film materials such as PVDF-TrFE based multilayer films have shown a relatively large magneto-electric response. While significant progress has been made in studying the magneto-electric films, the origin of the magneto-electric coupling in polymer-based nanoscale heterostructures has not been clearly established.

A novel material consisting of a multiferroic thin film using ferromagnetic iron layers and ferroelectric polyvinylidene fluoride (PVDF) was demonstrated to have electric polarization tunability at room temperature by subjecting an external magnetic field to the material at room temperature. In the new material, changing the direction of the applied magnetic field resulted in the switching of electric polarization for the PVDF. Further, both the coercivity and polarization of the multiferroic PVDF polymer material displayed hysteretic features as the applied magnetic field is changed.

The invention described herein teaches the production of ferromagnetic/ferroelectric heterostructures fabricated by sandwiching a layer of PVDF polymer between two layers of iron thin films. Another aspect of the present invention is that other polymer materials having similar properties may be used. Such polymers include PVDF based ferroelectric copolymers. As shown herein, detailed measurements demonstrated that these heterostructures exhibited substantial magneto-electric effect at room temperature. The electric properties of the PVDF polymer may be tuned when a magnetic field is applied to the sample and this tuning effect showed clear hysteresis upon magnetic field. It has also been discovered that the thickness of the PVDF layer impacted the magneto-electric coupling strength in a linear response.

Figure 1:
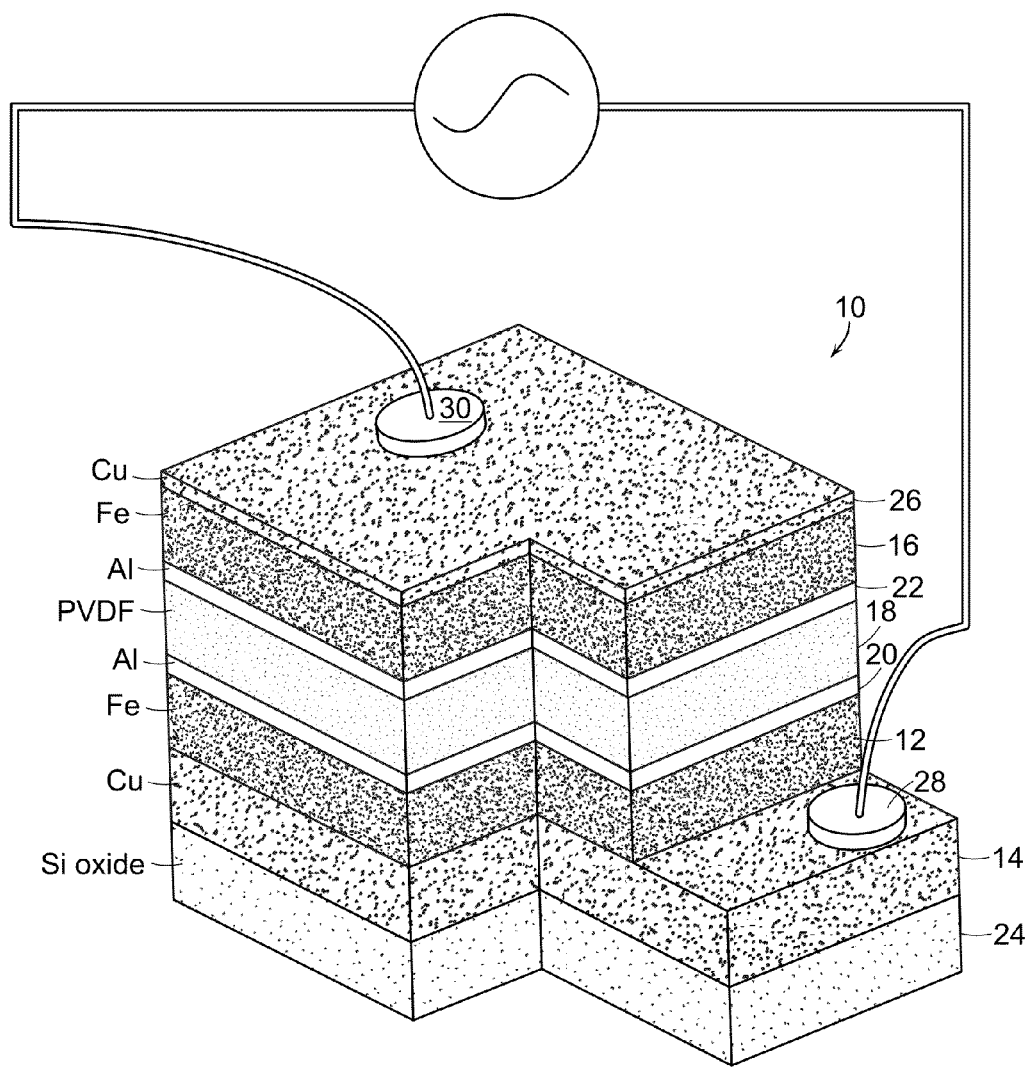
FIG. 1. shows a schematic illustration of a sample in accordance with an embodiment of the present invention.

In the present invention, a new and simpler approach to making multiferroic heterostructures has been developed that includes ferromagnetic iron layers and ferroelectric polyvinylidene fluoride (PVDF) polymer layer. A schematic of one such heterostructured multilayer material is shown at 10 in FIG. 1. The first iron layer 12 is deposited on a copper layer 14 at a thickness of 50 nm to 100 nm, and second iron layer 16 is deposited on a PVDF layer 18 at a deposition of 10 nm to 50 nm. Aluminum layers 20, 22 with the thickness of 3 nm to 5 nm each were used to avoid the interdiffusion between iron layers 12, 16 and PVDF layer 18. The copper layer 14 is provided on a base 24 of Si Oxide, and a second copper layer 26 is provided on second iron layer 16. The copper layers 14, 26 are deposited at a thickness of 500 nm to 1000 nm and electric leads 28, 30 are attached to both copper layers.

The multilayer material fabricated used a physical vapor deposition for magnetic layers and the Langmuir-Schaefer film fabrication method for PVDF layers. The thickness of each layer is precisely controlled and calibrated. A Radiant Technology Precision ferroelectric measurement system was used to measure the polarization versus electric field hysteresis loops of all the material samples. In performing the measurements, each sample was placed between the pole pieces of an electromagnet with the external magnetic field applied in parallel to the sample surface.

Example 1

Novel Multiferroic Heterostructure that is Differentially Polarizable by an External Magnetic Field.

Figure 2:
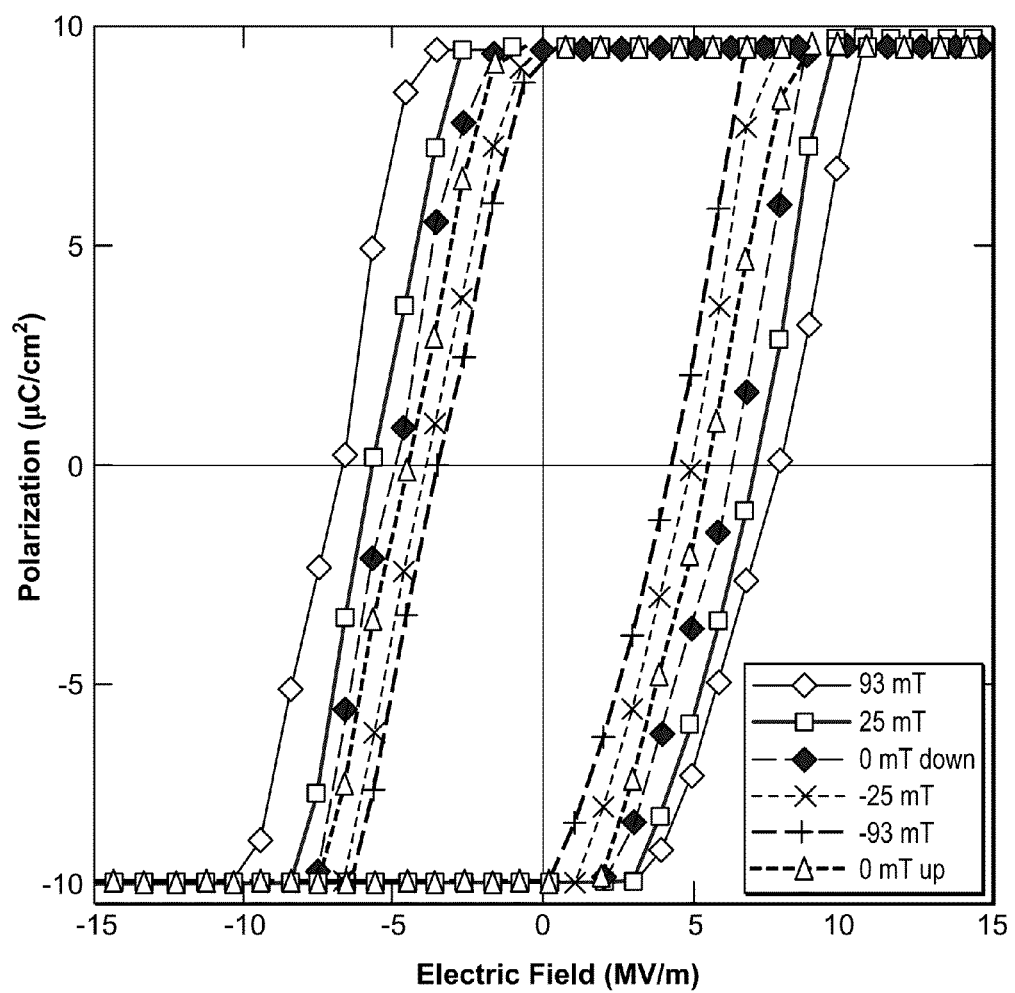
FIG. 2 shows a graphical illustration of P-E hysteresis loops of the Fe/PVDF/Fe heterostructure under different applied magnetic fields.

FIG. 2 shows a set of polarization versus electric field hysteresis loops measured under different magnetic fields for a multilayer sample with the key structure of Fe (80 nm)/PVDF (52 nm)/Fe (26 nm). The magnetic field was varied in such a way that it alternated from −93 mT to 93 mT and then from 93 mT to −93 mT again. Each polarization versus electric field loop was recorded at room temperature under an applied magnetic field. The surprising effect can be clearly seen as the magnetic field is applied and the subsequent effect on the electric properties of the PVDF polymer. The area under the polarization versus electric field loop showed a strong dependence on the external magnetic field. The energy product, area under polarization versus electric field loop, showed a minimum at −93 mT and then it increased as the external magnetic field was increased correspondingly. When the magnetic field is applied at −93 mT, as shown in FIG. 2, the polarization can be saturated at 6.8 MV/m, while the polarization is switched under coercivity of 4.3 MV/m. As the applied magnetic goes to zero, the electric polarization of the PVDF polymer layer saturates at electric field of 8.4 MV/m, and the coercivity is at 5.5 MV/m field. So the PVDF polymer becomes difficult to saturate and flip with magnetic field changed from −93 mT to 93 mT.

Figure 3:
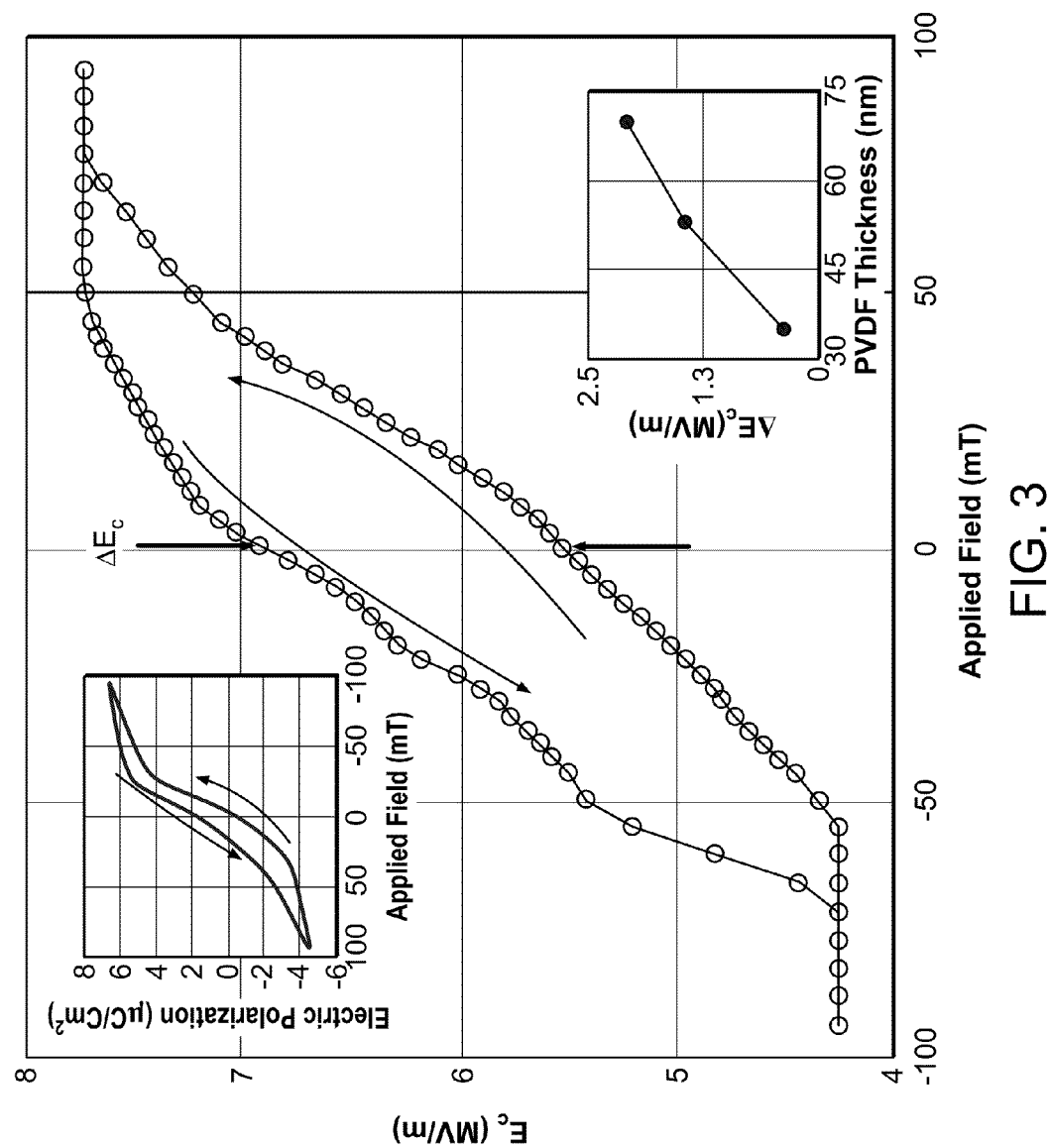
FIG. 3. shows a graphical illustration of electric coercivity as a function of the applied magnetic field; and the upper inset shows the polarization of the polymer as a function of the applied magnetic field; and the lower inset shows the change of the coercivity under magnetic field as a function of PVDF layer thickness.

In contrast, the polarization versus electric field loop was taken at 93 mT magnetic field showed that the polarization was saturated at an electric field of 10.8 MV/m and it can be flipped at 7.9 MV/m. When the magnetic field goes back to zero from the maximum field of 93 mT, the electric polarization saturates at electric field of 8.9 MV/m and the coercivity is at 6.2 MV/m electric field. The polarization versus electric field loop taken at this zero magnetic field (labeled as 0 mT down in FIG. 2) is different from the results taken at the other zero magnetic field, which changes from −93 mT (labeled as 0 mT up). The prior history of the sample therefore played an active role and hysteresis was evidenced as indicated in FIG. 3.

To further characterize the magneto-electric coupling of the sample, a bias electric field of 6.0 MV/m was taken and plotted the polarization versus magnetic field. This result is shown as the upper inset of FIG. 3. In addition, the electric coercivity of the PVDF polymer layer under different magnetic fields was plotted as shown in FIG. 3. From this graph, it was clearly shown that both the electric polarization and the electric coercivity displayed a hysteretic feature upon external magnetic field.

Example 2

PVDF Polymer Thickness Impacts Magneto-Electric Coupling

Since the magneto-electric coupling was present in this sample, a series of samples with different PVDF polymer thickness were evaluated while the ferromagnetic iron layers were kept at a constant thickness. In order to compare the magneto-electric coupling strength in each of the samples, $\Delta E_C$, the width of the hysteresis curve of $E_C$-H field graph (shown the black arrow), was plotted as a function of PVDF thickness shown as the lower inset of FIG. 3. The width $\Delta E_C$ showed the effect of the magnetic field on the ferroelectric property at different thicknesses. It was clearly demonstrated that the wider the $\Delta E_C$, the stronger the magneto-electric coupling strength. Furthermore, it was found that as the PVDF thickness increases, the width $\Delta E_C$ of the $E_C$-H hysteresis loops coordinately increased.

The increase in $\Delta E_C$ indicated that the magneto-electric coupling strength became substantially larger as the PVDF thickness increased. This cannot be explained by the simple strain effect. First, according to strain effect, the magnetostriction stress was kept the same for all our samples by keeping the ferric layers unchanged. When this same stress (or pressure) is applied to a thicker PVDF layer, the effect is expected to be smaller which is contradictory to our observed data. Second, magnetostriction should not be dependent upon the polarity of magnetic field for a strain effect, while these data showed sole dependency on the polarity of the magnetic field. It is believed that this is due to the significant magnetic field in the polymer layer generated by Fe ferromagnets. This magnetic field exerted a force on rotating dipoles of PVDF and affected the rotation of those dipoles. Further, the direction of this force was dependent on the polarity of the magnetic field. This magnetic force was able to affect and tune the polarization properties of the novel PVDF layer.

The magneto-electric coupling sensitivity is often used to characterize the performance of a magneto-electric material, and it is defined as $$\alpha_E = \frac{\Delta E}{\Delta H},$$

which quantifies the sensitivity for a ferroelectric layer as the applied magnetic field is changed. The sensitivity $\alpha_E$ was estimated for each of samples analyzed. The change in the electric field of the polymer layer was estimated using the polarization versus magnetic field graphs. The values of magneto-electric coupling sensitivity $\alpha_E$ of these experiments are 3700 V×cm$^{-1}$×Oe$^{-1}$, 30000 V×cm$^{-1}$×Oe$^{-1}$ and 41700 V×cm$^{-1}$×Oe$^{-1}$, for PVDF thickness of 35 nm, 52 nm, and 70 nm, respectively. The observed magneto-electric coupling sensitivities are as much as 2 orders of magnitude higher than previously reported values. When the thickness of PVDF is increased, the sensitivity increases. The thickness of the PVDF should reside between 20 nm and 100 nm.

In the prepared multiferroic film materials, it was demonstrated for the first time at room temperature that giant magneto-electric coupling in heterostructures could be easily produced by applying an external magnetic field. A further aspect of the invention is that one was able to tune the electric polarization of the ferroelectric PVDF layer. More importantly, as the applied magnetic field is varied, the properties of PVDF layer show hysteretic features. The variety of the material and affect was also shown that changing the thickness of the PVDF layer impacted linearly the magneto-electric coupling strength between the ferroelectric and ferromagnetic layers. The magneto-electric coupling sensitivity was estimated which is in the range of 3700 V/(cm×Oe) to 41700 V/(cm×Oe) for various samples.

Those skilled in the art will appreciate that numerous modifications and variations may be made to the above disclosed embodiments without departing from the spirit and scope of the present invention.

What is claimed is:

1. A ferromagnetic/ferroelectric heterostructure thin film exhibiting significant magneto-electric coupling, comprising:
   a. a base layer of silicon substrate;
   b. a first copper layer deposited on the silicon substrate;
   c. a first iron layer deposited on the copper layer;
   d. a first aluminum layer deposited on the first iron layer;
   e. a polymer layer exhibiting ferroelectric properties deposited on the first aluminum layer;
   f. a second aluminum layer deposited on the polymer layer;
   g. a second iron layer deposited on the second aluminum layer; and
   h. a second copper layer deposited on the second iron layer.

2. The ferromagnetic/ferroelectric heterostructure thin film of claim 1, further comprising attached electric leads coupled to the first and second copper layers.

3. The ferromagnetic/ferroelectric heterostructure thin film material of claim 1, further comprising the use of a magnetic field or electric voltage to control and tune the magneto-electric coupling of the ferromagnetic/ferroelectric heterostructure material.

4. The ferromagnetic/ferroelectric hetero structure thin film material of claim 1, wherein the first iron layer is deposited on a copper layer at a thickness of 50 nm to 100 nm.

5. The ferromagnetic/ferroelectric Hetero structure thin film material of claim 1, wherein the second iron layer is deposited on the aluminum layer at a thickness of 10 to 50 nm.

6. The ferromagnetic/ferroelectric heterostructure thin film material of claim 1, wherein the thickness of the polymer layer is between from 20 nm to 100 nm.

7. The ferromagnetic/ferroelectric hetero structure material of claim 6, wherein the polymer layer is polyvinylidene fluoride.

8. The ferromagnetic/ferroelectric hetero structure thin film material of claim 1, wherein the thickness of the first or second aluminum layer is between from 3 nm to 5 nm.

9. The ferromagnetic/ferroelectric hetero structure thin film material of claim 1, wherein the thickness of the first or second copper layer is between from 500 nm to 1000 nm.

10. The ferromagnetic/ferroelectric hetero structure thin film material of claim 3, wherein the magneto-electric coupling is tunable at temperature between 40° F. and 100° F.

11. The ferromagnetic/ferroelectric hetero structure thin film material of claim 10, wherein the magneto-electric coupling is tunable at room temperature.

* * * * *

UNITED STATES PATENT AND TRADEMARK OFFICE
CERTIFICATE OF CORRECTION

PATENT NO. : 9,130,144 B2  
APPLICATION NO. : 14/397044  
DATED : September 8, 2015  
INVENTOR(S) : Yang et al.

Page 1 of 1

It is certified that error appears in the above-identified patent and that said Letters Patent is hereby corrected as shown below:

In the Claims

Column 6, line 1 claim 4, line 4 claim 5, line 10 claim 7, line 13 claim 8, line 16 claim 9, line 19 claim 10, line 22 claim 11, delete "hetero structure" insert --heterostructure--

Signed and Sealed this  
Nineteenth Day of January, 2016

Michelle K. Lee  
*Director of the United States Patent and Trademark Office*